United States Patent
Vemuri et al.

(10) Patent No.: US 10,795,845 B1
(45) Date of Patent: Oct. 6, 2020

(54) METHOD AND SYSTEM FOR AUTO-ADDRESSING NODES ON A COMMUNICATION BUS

(71) Applicant: Texas Instruments Incorporated, Dallas, TX (US)

(72) Inventors: Arun Tej Vemuri, Dallas, TX (US); Donovan Allen Porter, Dallas, TX (US); Fernando David Lara Alva, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/549,487

(22) Filed: Aug. 23, 2019

(51) Int. Cl.
| | |
|---|---|
| *G06F 3/00* | (2006.01) |
| *G06F 13/40* | (2006.01) |
| *H03K 17/687* | (2006.01) |
| *H04L 12/40* | (2006.01) |
| *H04L 12/64* | (2006.01) |
| *H04W 4/80* | (2018.01) |

(52) U.S. Cl.
CPC ......... *G06F 13/404* (2013.01); *H03K 17/687* (2013.01); *H04L 12/40013* (2013.01); *H04L 12/6418* (2013.01); *H03K 2217/0072* (2013.01); *H04L 2012/6421* (2013.01); *H04W 4/80* (2018.02)

(58) Field of Classification Search
None
See application file for complete search history.

(56) References Cited

U.S. PATENT DOCUMENTS

| | | | | |
|---|---|---|---|---|
| 5,964,815 | A * | 10/1999 | Wallace | B60R 21/01 180/282 |
| 10,361,996 | B2 | 7/2019 | Schmitz et al. | |
| 10,367,782 | B2 | 7/2019 | Schmitz et al. | |
| 10,368,423 | B2 | 7/2019 | Sturm et al. | |
| 2006/0282549 | A1 * | 12/2006 | Vinnemann | H04L 12/403 710/3 |
| 2007/0204082 | A1 * | 8/2007 | Shimizu | H04L 12/40169 710/110 |
| 2009/0248932 | A1 * | 10/2009 | Taylor | G06F 13/24 710/110 |
| 2014/0035532 | A1 * | 2/2014 | Brandl | H02J 7/0016 320/128 |
| 2014/0375288 | A1 * | 12/2014 | Nora | H02M 3/1584 323/272 |
| 2016/0092388 | A1 | 3/2016 | Sorenson et al. | |
| 2016/0205066 | A1 * | 7/2016 | Attarwala | H04L 12/40 709/208 |
| 2017/0243423 | A1 * | 8/2017 | Schindler | G07C 9/00309 |

* cited by examiner

*Primary Examiner* — Henry Tsai
*Assistant Examiner* — Dean Phan
(74) *Attorney, Agent, or Firm* — Ray A. King; Charles A. Brill; Frank D. Cimino

(57) ABSTRACT

An auto addressing scheme comprised of a central/master module and satellite/slave devices on a communication bus such as CAN that individually wakes the satellite devices alerting them when to listen to the CAN bus to receive their address, eliminating the need for a separate bus for auto addressing. The wake function is handled by low side n-channel MOSFET switches with current limiting resistors to protect the circuit against short to battery conditions and a voltage divider to step down the voltage to levels tolerable for a microcontroller input.

20 Claims, 4 Drawing Sheets

METHOD AND SYSTEM FOR AUTO-ADDRESSING NODES ON A COMMUNICATION BUS

BACKGROUND

Automobile manufacturers have been adding Bluetooth Low Energy (BLE) capability for numerous applications including, for example, passive entry passive start (PEPS) which employs a key fob or digital key from a smart phone that can send a signal to a smart key module to trigger the mechanism to unlock the automobile door. When used in conjunction with BLE, the smart key module system can include a central module and several satellite modules distributed throughout the body of the car, each with a receiver capable of receiving a signal from a key fob or smart phone. A typical system can have multiple satellite modules, between eight and twelve in some cases, in addition to a central module. It is desired that the PEPS system be able to determine when the driver is within the unlocking zone of the vehicle (1-2M away), and the approximate location of the key holder. This is done by triangulating the signals received by the various satellite (or slave) modules that are distributed throughout the car in numerous known locations such as the passenger side door, behind seat cushions, rocker panel, trunk, or rear bumper.

A master or central module communicates with the satellite or slave modules using a communication interface on the automobile's Controller Area Network (CAN) bus. The central module addresses each satellite module for data related to gaining entry access to the car so that the central module can determine whether to grant entry access to the car or allow the driver to start driving the car after gaining access. In order to triangulate the signals received from the satellite modules and determine the location of the key fob, the central module must know the location of each satellite module sending data to it. The central module is able to determine which satellite module it is receiving data from based on the bus address of the satellite module sending the data because the central module knows the sequence order of satellite bus address assignment. In this way, the central module is able to correlate the communication bus address to the location of the satellite in the automobile. Rather than having a unique printed circuit board for each satellite module with the bus address hard-wired or hard-coded in, it would be advantageous to system designers to have a single hardware board design with a single software program for all the satellite modules. This avoids the added inventory cost and manufacturing complexity of multiple SKUs or part numbers and allows any of the satellite modules to be installed in any of the locations. Having a single hardware board design and a single software program does not allow the bus address to be assigned to the satellite module prior to installation. Since the hardware and software of the satellite nodes are all identical and unaddressed at the time of installation into the automobile, a scheme is required for the central module to assign a unique CAN bus address to each satellite module after the modules are installed in the automobile. This process of assigning a unique address to each satellite module is referred to as auto addressing.

Presently, assignment of network bus addresses to satellite modules in automobiles is accomplished using a dedicated Local Interconnect Network (LIN) bus with the satellites daisy-chained on the bus. A second network interface is then used for communication of access-related data. The central module sends an address to the first satellite over the LIN bus, and then the first satellite will send an address received from the central module to the second satellite using the LIN bus. This process continues until all the satellite modules have been addressed. This scheme requires two LIN physical layers (PHYs) per satellite module as well as one for the master or central module. On the satellite modules, one LIN PHY is for receiving data and one for transmitting data. The LIN PHYs are only used for the auto-addressing operation, not for standard data communications which is done on the CAN bus or a different network bus. A typical automobile might have 12 satellite modules. This means that 26 LIN PHYs must be added to the system just for auto addressing, increasing system cost and complexity. A need arises for a simpler and more cost effective method for assigning network bus addresses to satellite modules in automobiles without the need for LIN PHYs dedicated to auto addressing modules on the network bus.

SUMMARY

This Summary is provided to introduce the disclosed concepts in a simplified form that are further described below in the Detailed Description including the drawings provided. This Summary is not intended to limit the claimed subject matter's scope.

Disclosed embodiments describe a scheme for auto addressing satellite modules on a communication bus, such as CAN, without the need for a separate bus, such as LIN, with transceivers in each module dedicated to the auto addressing function. In one disclosed embodiment, a nominal 12 volt battery level signal is daisy-chained to the satellite modules in order to sequentially wake each of the satellite module alerting it to listen to the CAN bus to receive its address assignment. Once addressed, the newly addressed satellite module then sends an acknowledgment signal back on the communication bus to the central module and sends a wake signal, which could be at 12 volts, to the next satellite module in the sequence.

Disclosed embodiments include using an n-channel MOSFET as a low side switch to deliver the auto address wake signal, which is preferably a pulse-width-modulated signal for improved noise immunity. Disclosed embodiments also include a voltage divider circuit to step down the auto address wake signal from battery voltage level to levels acceptable for a microcontroller input. This circuit also includes current limiting resistors for short circuit and battery load dump surge protection.

Additionally, disclosed embodiments include a mechanism for detecting shorts and open circuits in the satellite modules or associated wiring by alerting when a satellite module fails to report it has received its auto address wake signal. The central module can determine the location of the satellite module indicating a fault because the address the central module is assigning will be assigned to the satellite module at a given known location.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

CAN is a specialized internal communications network that interconnects components inside a vehicle serial bus standard designed to allow microcontrollers and devices to communicate with each other in applications without a host computer. Two or more nodes are required on the CAN network to communicate. The nodes are connected to each other through a two-wire serial bus. Each node requires a central processing unit to interpret the messages it receives and what messages it wants to transmit, a CAN controller which is often integrated into the processing unit, and a CAN transceiver. Each node is able to send and receive messages, but not simultaneously. A message or frame consists primarily of the identifier (address) and up to eight data bytes. A cyclic redundancy check (CRC), acknowledge slot (ACK) and other overhead are also part of the message.

The CAN bus was originally designed for automobiles, but is used in numerous other contexts as well, such as aviation and navigation, elevators and escalators, industrial and building automation and medical equipment. The present invention is applicable to all CAN bus applications involving multiple slave or satellite nodes. Additionally, this invention is not limited to use with CAN bus, but may be used with any serial communication bus system having a central or master unit and one or more slave or satellite units, such as LIN bus.

Figure 1:
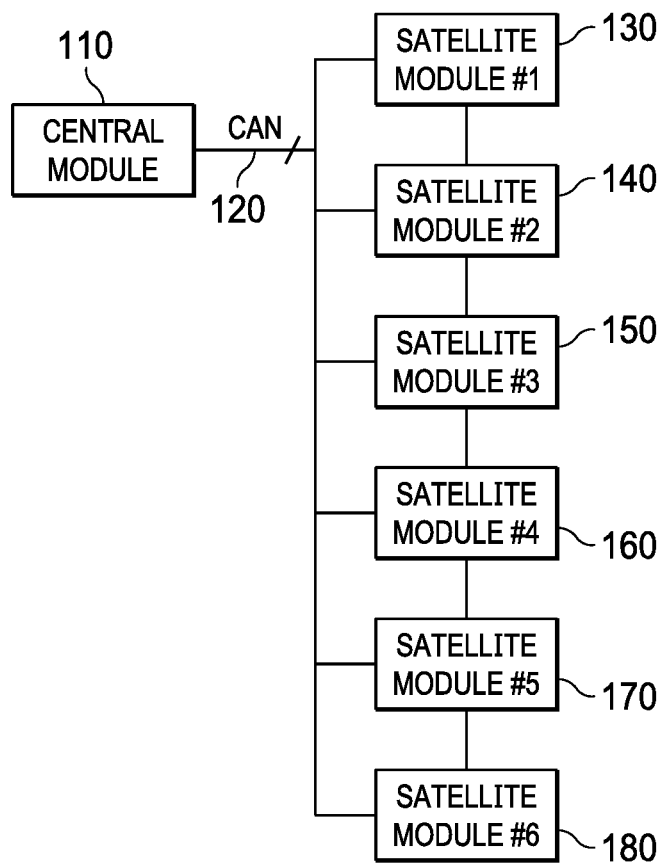
FIG. 1 shows a system block diagram for an auto-addressing scheme.

FIG. 1 illustrates a system diagram of a communication bus auto-addressing scheme. The system includes a central module 110 that serves as the master on the CAN bus 120. Satellite modules, which are located at various known positions throughout the automobile, are configured as slaves on the communication bus.

FIG. 1 shows a system with a central module and six satellite modules. However, there could be more or less than six satellite modules depending upon system requirements. The satellite modules are daisy-chained together via input and output signals wherein the output signal of one satellite module is the input signal for the next satellite module. They also share a common bus data connection along with the central module, which could be a CAN bus, LIN bus, or another type of serial communication bus. For purposes of illustration, an embodiment with CAN bus will be shown here.

The first satellite module is shown as 130 in the figure and is connected to the central module 110 along with each of the other satellite modules via the communication bus 120. The first satellite module 130 is also connected to the central module 110 and to the second satellite module 140 via input and output lines. The second satellite module 140 is connected to the first satellite module 130 and to the third satellite module 150 via input and output lines. Satellite modules 4, 5, and 6 are denoted in the figure as 160, 170, and 180, respectively. Data communication on the communication bus 120 is bidirectional meaning that each module can send to and receive from the other modules on the bus. Each node is able to send and receive messages, but not simultaneously. There is an arbitration method in the CAN bus standard to handle collisions on the bus. To enable communication, each node on the bus must be assigned an address and will ignore bus communication unless it is sent to its address.

The bus addresses on the communication bus are assigned to each satellite module sequentially and in a known order. The central module is programmed to know the location where each module is installed. The satellite modules are daisy-chained in a preset known order, so that each time a bus address is assigned to a satellite module, the location of the satellite module is known by where it is in the daisy-chain order. In this way, a particular bus address will always correspond to a known satellite module whose location is known. Therefore, the satellite module bus address can always be used to correlate to the exact location of the satellite module. This is necessary for being able to triangulate the signals from multiple satellite modules to determine the approximate location of a PEPS key holder. This is also useful for determining the location of faulty wiring or a faulty satellite module in the event where a particular satellite module with a known bus address fails to acknowledge to the central module that it has been successfully addressed.

Figure 2:
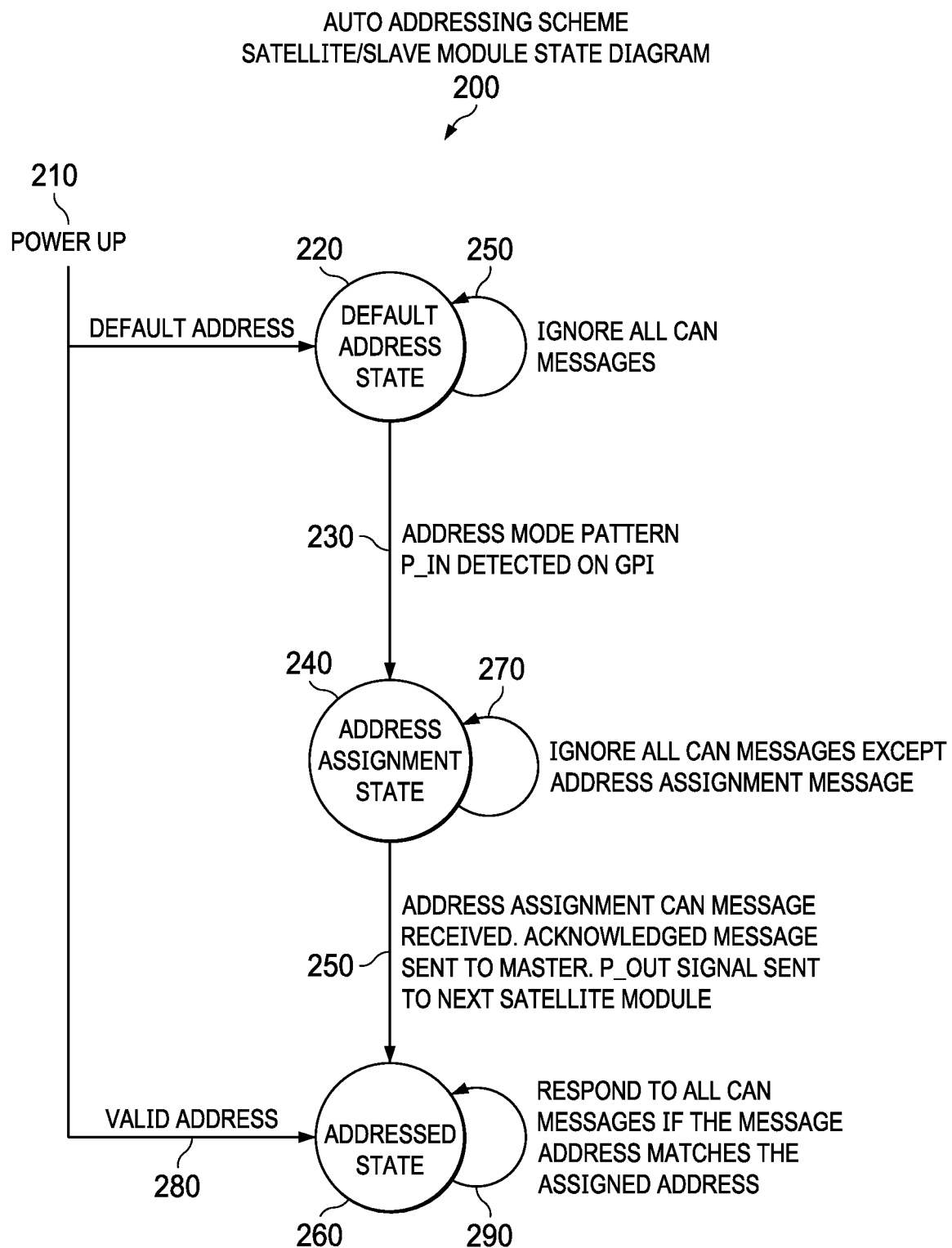
FIG. 2 shows a flow chart for a scheme for auto-addressing satellite modules on a communication bus.

FIG. 2 shows a state diagram for an example embodiment of an auto addressing scheme 200 for satellite modules according to an aspect of the present disclosure. The auto addressing scheme 200 begins with power up 210. At power up 210, each of the satellite modules is in the default address state 220 during which its communication bus response 250 to data on the bus is to ignore all messages and data on the communication bus. Each satellite module 130-180 ignores all data on the communication bus because it does not yet have an address assigned to it, so the satellite modules cannot determine if the data on the bus is intended for it. Therefore, it ignores the data until it is later awakened by a signal that a valid address for that module is on the bus ready to be received.

Following power up 210, the central module 110 from FIG. 1 sends a signal 230 using its low side switch to the first satellite module 130 indicating that the central module is ready to assign a communication bus address to it. The signal 230 could be in the form of a single pulse, a series of pulses, a pulse-width-modulated signal, or any other series of patterned pulses which a microcontroller in the satellite module being addressed compares to the expected signal and validates. Since this signal 230 is not sent via the communication bus, but is instead a separate signal sent only to the first satellite module 130, the other satellite modules 140-180 do not receive signal 230 from the central module 110.

Upon receiving the signal 230 that the central module is ready to send the first address, the satellite module 130 enters the address assignment state 240 and waits for the central module 110 to send an address. The bus response 270 of satellite module 130 is now to ignore all messages on the communication bus except for the address assignment message. At this time, the remaining satellite modules 140-180 remain in the default address state 220 and their communication bus response 250 remains to ignore all messages and data on the communication bus.

The central module 110 then sends an address assignment message for satellite module 130 via the communication bus. Since satellite module 130 is the only module on the bus waiting to receive an address assignment, it assigns the received address to itself while the other satellite modules continue to ignore the message on the bus.

After assigning itself the received address, satellite module 130 exits the address assignment state 240 and sends an acknowledgment message back to the central module via the communication bus notifying the central module that it has received its address. The satellite module 130 is now in the addressed state 260 and its communication bus response 290 to data on the bus is to respond to all communication bus messages where the bus address matches its assigned address. A similar process then begins for addressing the second satellite module.

Next, satellite module 130 then uses its low side switch to send a signal 230 to the next satellite module 140 indicating that a communication bus address is ready to be assigned to satellite module 140. Satellite module 140 then enters the address assignment state 240 and waits for the central module 110 to send an address. The bus response 250 of satellite module 140 is now to ignore all messages on the communication bus except for the address assignment message. At this point, satellite modules 150-180 remain in the default address state 220 and their communication bus response 250 continues to be ignore all messages and data on the communication bus, and satellite module 130 will only respond to messages that have its assigned address.

The central module 110 then sends an address assignment message for satellite module 140 via the communication bus. Satellite module 130 has been addressed and can see that this message is not being sent to its address, so it ignores the message. Satellite modules 150-180 are still in the default address state, so they continue to ignore all data on the communication bus. Since satellite module 140 is the only module on the bus waiting to receive an address assignment, it assigns the address on the communication bus to itself while each of the other satellite modules ignores the data on the bus.

After assigning itself the address, satellite module 140 exits the address assignment state 240 and sends an acknowledgment message back to the central module via the communication bus notifying the central module that it has received its address. The satellite module 140 is now in the addressed state 260 and its communication bus response 290 to data on the bus is to respond to all communication bus messages where the address matches its assigned address. The same process is repeated until all satellite modules have their address assigned.

Once the last satellite module has been addressed, there will be no satellite module to receive the address assignment signal, and the process will end. Though FIG. 1 shows a system with six satellite modules, the process of FIG. 2 can be used with any number of satellite modules two or greater.

There may be an instance 280 where a satellite module receives an address assignment message and already has a valid address assignment. This can occur in situations where for instance, that particular satellite module has previously been in the system and was already assigned a bus address. The bus address may have been stored in static memory, allowing the satellite module to retain its address. If this occurs, that satellite module will send an acknowledgment message back to the central module indicating that it has a valid bus address and will send an address assignment message to the next satellite module in the chain.

Figure 3:
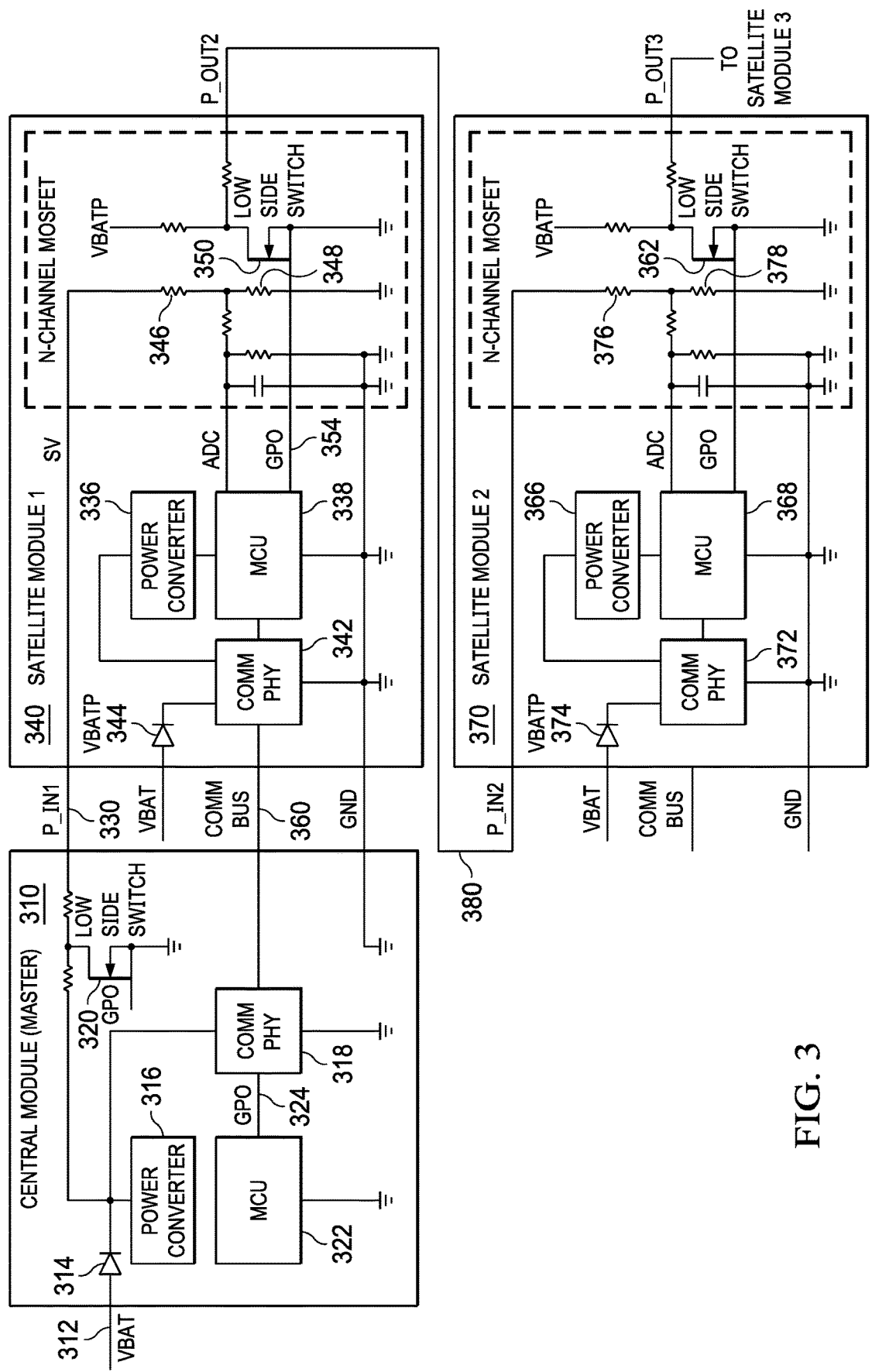
FIG. 3 shows a schematic diagram of a system for auto-addressing satellite modules on a communication bus.

FIG. 3 shows an example embodiment of a circuit diagram illustrating the interconnection between the central module and the satellite modules. For the sake of simplicity, only two satellite modules are shown in the figure, but there could also be any greater number of satellite modules in the system.

In accordance with various embodiments, a central module 310 is shown coupled to a first satellite module 340 by general purpose input/output (GPIO), and satellite module 340 is also coupled to satellite module 370 by GPIO. Additionally, central unit 310, satellite module 340 and satellite module 370 are interconnected via a common bus, which is shown as a CAN bus, but could also be LIN bus or another type of serial communication bus.

The central module 310 includes a battery voltage input 312 coupled to the anode of diode 314 which protects the system against back surges on the battery line and the reversal of battery polarity. The cathode of diode 314 is coupled to the input of a power converter 316, a communications physical layer (Comm PHY) 318, and to the drain of an n-channel metal oxide semiconductor field effect transistor (MOSFET) 320, which is the low side switch for the central module 310. The coupling between the cathode of diode 314 and the drain of low side switch 320 could be direct or through a resistor. A n-channel MOSFET is only one example of a switch that can be used for the low side switch. Other types of switches could be used in other embodiments.

The Comm PHY 318 is coupled to MCU 322 which has a GPIO 324 that is coupled to the gate of low side switch 320. The source of low side switch 320 is coupled to ground. The Comm PHY 318 is also coupled to microcontroller unit (MCU) 322 and to the Comm PHY 342 of the first satellite module 340 through the communications bus (Comm Bus) 360 and communicates with each of them bidirectionally. The drain of the low side switch 320 of the central module 310 is resistively coupled to the gate of the low side switch 350 of the first satellite module 340.

The first satellite module 340 includes a battery voltage input 312 coupled to the anode of diode 344 which protects the module against back surges on the battery line and the reversal of battery polarity. The cathode of diode 344 is coupled to a communications physical layer (Comm PHY) 342 which is coupled to and provides the input for a power converter 336 which provides power for MCU 338. In an alternative embodiment, the power converter 336 may receive an input from the cathode of diode 344.

The Comm PHY 342 is coupled to MCU 338 which has a GPIO 354 that is coupled to the gate of low side switch 350. The source of low side switch 350 is coupled to ground and the drain is resistively coupled to the cathode of diode 344. The Comm PHY 342 is also coupled to MCU 338 and to the Comm PHY 372 of the second satellite module 370 through the Comm Bus 360 and communicates with each of them bidirectionally. The drain of low side switch 350 of the first satellite module 340 is resistively coupled to the gate of low side switch 362 of the second satellite module 370.

The second satellite module 370 is an identical design to the first satellite module 340 with Comm PHY 372, MCU 368, power converter 366, low side switch 362 and diode 374. For simplicity, only two satellite modules are shown in the figure, but there may be more than two satellite modules in the system which would also be of the identical design and would be daisy-chained in like manner with the drain of each low side switch resistively coupled to the gate of the low side switch of the next satellite module.

At power up, satellite modules 340 and 370 are in the default address state 220 and will ignore all messages and data on the communication bus because they do not yet have an address assigned to them. Since the satellite module cannot determine if the data on the bus is intended for it, it ignores all data. When power is applied to the central module at the battery voltage node 312, the MCU 322 and Comm PHY 318 go through their initiation routines.

Auto addressing of the satellite modules begins with MCU 322 outputting a pulse or series of pulses through a general purpose output node 324 which is coupled to the gate of low side switch 320. In one embodiment, the series of pulses is a pulse-width-modulated (PWM) pattern for improved noise immunity. The drain of the low side switch 320 receives the battery supply voltage input from the cathode of diode 314 and the source is coupled to ground. With no input to the gate of low side switch 320, the voltage at 330 is near the upper rail, and when the voltage at the gate of low side switch 320 is high, the voltage at 330 is near ground.

A PWM pattern is sent from MCU 322 causing the output 330 of low side switch 320 to send a PWM pattern to satellite 340, where a voltage divider made up of resistors 346 and 348 step the battery voltage down to a level tolerable to MCU 338 which receives the pattern at its GPIO. Once MCU 338 validates that it has received the correct pattern, satellite module 340 enters the address assignment state 240 and begins listening to the communication bus through its Comm PHY 342 which is receiving messages sent from the central module 310 through its Comm PHY 318 on the communication bus 360.

The central module 310 is constantly sending data over the communication bus 360 to a default ID with the new address for the satellite node. Once satellite module 340 has received the address, it enters the addressed state 260 and sends an acknowledge message back to the central module MCU 322 via the communication bus 360 causing the central module to increment to the next address in its predetermined pattern. Satellite module 340 then continues the process by sending a signal to satellite module 370 to begin its auto addressing.

A PWM pattern is sent from MCU 338 causing the output 380 of low side switch 350 to send a PWM pattern to satellite 370, where a voltage divider made up of resistors 376 and 378 step the battery voltage down to a level tolerable to MCU 368 which receives the pattern. Once MCU 368 validates that it has received the correct pattern, satellite module 370 enters the address assignment state 240 and begins listening to the communication bus through its Comm PHY 372 which is receiving messages sent from the central module 310 through its Comm PHY 318 on the communication bus 360.

The central module 310 is constantly sending data over the communication bus 360 to a default ID with the new address for the satellite module. Once satellite module 370 has received the address, it enters the addressed state 260 and sends an acknowledge message back to the central module MCU 322 via the communication bus 360. If there are more satellite modules to be addressed, then the process will repeat with low side switch 362 sending a PWM pattern to the next satellite module and the central module sending the next address to the default ID via the communication bus. This process will continue until all satellite modules have been addressed.

An added benefit of this auto addressing scheme is that it allows shorts and ground faults in satellite modules to be detected and be reported by the central module as the auto addressing process occurs. Occurrences of opens and shorts are particularly prevalent in automobiles where an increased rate of wiring harness issues may occur. If there is a short to ground or to battery on the auto-addressing line, the central module will never receive the acknowledge message from the satellite module that is being addressed. The central module will be able to report the approximate area where the fault occurred because it knows which satellite module failed to send a proper acknowledgment signal, and it further knows the location of the faulty satellite module because the address the central module is assigning will always be assigned to the satellite module in a specific known location of the vehicle. This report can be sent, for instance, to external circuitry or to a central processing unit to determine what action to take.

In the case where a satellite module needs to be replaced, the auto addressing scheme can be run to address the replaced module. The only difference in this situation is that the majority of satellite modules will already have a communications bus address. If a satellite module already has an address when the auto address process is run, it will send an acknowledge signal back to the central module and the process continue. In this situation where the satellite module that already has an address receives the auto address signal, 330 or 380 in FIG. 3, the satellite module will just send the acknowledge message back to the central module via the communications bus and put out its own auto address signal to trigger the next satellite module to enter the address assignment state.

A potential issue that should be addressed is the ability of the circuit to survive shorts to power and ground. Automobiles inherently have an increased rate of issues with shorts due to increased failures in wiring harnesses. This problem is handled in existing solutions by the LIN bus because ground and power fault protection is built into the LIN specification as a requirement to be LIN 2.0 compliant. However, if CAN bus or another type of serial bus is used for communication, there is a need to ensure survivability of the circuit if a short to power or ground occurs.

This can be handled by a current limiting protection circuit incorporated as part of a voltage divider circuit to step down the voltage of the battery level auto-addressing signal to a voltage that is tolerable to an MCU input. A typical input voltage for an MCU could be 3.3 V. However, other implementations could provide for an input to the MCU at 5V or 1.8V. The design must take into account the wide range of automobile battery operating voltages from 9-16 V and potential load dump conditions of up to 40V.

Figure 4:
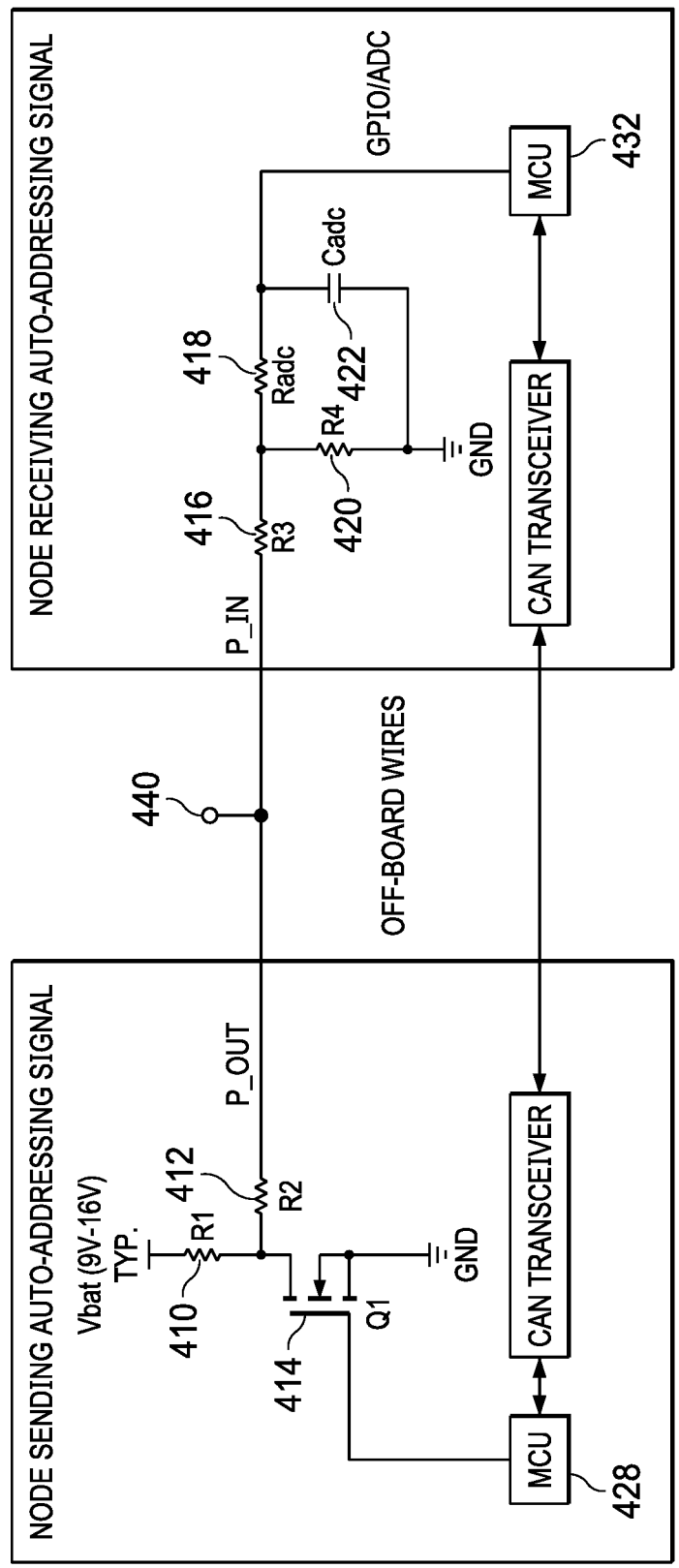
FIG. 4 shows a schematic diagram for a current limiting and battery voltage divider circuit.

FIG. 4 shows a schematic of the voltage divider circuit. Resistor 410 is coupled to the battery supply node, to resistor 412 and to the drain of low side switch 414 of a satellite module that will be sending an auto address signal. The other side of resistor 412 is coupled to resistor 416 on the next satellite module that will be receiving the auto address signal. The other side of 416 is coupled to resistors 420 and 418.

The resistor values of 410, 416 and 420 should be large enough to reduce the current delivered to the satellite MCU general purpose input in a worst case load dump condition to within its maximum rated limit. The ratios of the resistors should be chosen to limit the maximum voltage seen at the satellite MCU general purpose input to within its rated limit. The values and ratings of resistors 412, 416 and 420 should be chosen to handle the current and power present at worst case load dump condition. Resistor 410 can be a much smaller value than resistor 416 and resistor 420 if desired to simplify the voltage divider calculation. Resistor 412 can be approximately the same value as resistor 410.

In one embodiment, typical values chosen for resistor 410 and resistor 412 could 102 Kohm each, while typical values of resistor 416 and resistor 420 could be chosen as 1.6 Mohm and 402 Kohm, respectively. With these values, the voltage at the satellite MCU general purpose input would be substantially equal to 0.8 V when the battery voltage is 9 V, and would be substantially equal to 3.9 V when the battery voltage is at 40 V.

In the case of a short to battery, resistor 412 will be required to protect low side switch 414 if it is turned on. If this occurs, current will flow through 412, then from drain to source of low side switch 414 to ground. Since the on resistance of 414 will be very low, the short circuit current flow will be the battery voltage divided by the value of resistor 412.

There should be little risk for damaging circuits if a short to ground occurs provided that the resistor values are chosen properly. If low side switch 414 turns on, resistor 410 will protect 414 by limiting the current that flows through 414 to within its rated limits.

The terms "substantially the same," "substantially equal," and "approximately the same" purport to describe a quantitative relationship between two objects. This quantitative relationship may prefer the two objects to be equal by design but with the anticipation that a certain amount of variations can be introduced by the fabrication process. In one aspect, a first resistor may have a first resistance that is substantially equal to a second resistance of the second resistor where the first and second resistors are purported to have the same resistance, yet the fabrication process introduces slight variations between the first resistance and the second resistance. Thus, the first resistance can be substantially equal to the second resistance even when the fabricated first and second resistors demonstrate slight difference in resistance. This slight difference may be within 5% of the design target. In another aspect, a first resistor may have a first resistance that is substantially equal to a second resistance of a second resistor where the process variations are known a priori, such that the first resistance and the second resistance can be preset at slightly different values to account for the known process variations. Thus, the first resistance can be substantially equal to the second resistance even when the design values of the first and second resistance are preset to include a slight difference to account for the known process variations. This slight difference may be within 5% of the design target.

While operations are depicted in the drawings in a particular order, this should not be understood as requiring that all illustrated operations be performed to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An apparatus for auto addressing nodes on a communication bus comprising:
    a central module including:
        a central power converter having a central power converter output;
        a central module microcontroller unit (MCU) having a general purpose input and output and a communication port;
        a central module communication bus physical layer (PHY) having a first input/output port coupled to a communication bus and a second input/output port coupled to the communication port of the central module MCU; and
        a central module low side switch having a control terminal coupled to the general purpose output of the central module MCU, a first current terminal coupled to the central power converter output, and a second current terminal coupled to ground;
    a first satellite module including:
        a first power converter having a first power converter output;
        a first satellite MCU having a general purpose input and output and a communication port, in which a general purpose input is coupled to the first current terminal of the central module low side switch and receives a first wake pulse;
        a first satellite communication bus PHY having a first input/output port coupled to the communication bus and a second input/output port coupled to the communication port of the first satellite MCU; and
        a first satellite low side switch having a control terminal coupled to the general purpose output of the first satellite MCU, a first current terminal coupled to the first power converter output, and a second current terminal coupled to ground; and
    a second satellite module including:
        a second power converter having a second power converter output;
        a second satellite MCU having a general purpose input and output and a communication port, in which the input is coupled to the of the first current terminal of the first satellite low side switch and receives a second wake pulse;
        a second satellite communication bus PHY having a first input/output port coupled to the communication bus and a second input/output port coupled to the communication port of the second satellite MCU.

2. The apparatus of claim 1, in which the first wake pulse and second wake pulse are a series of pulses.

3. The apparatus of claim 1, in which the first wake pulse and second wake pulse are pulse-width-modulated signals.

4. The apparatus of claim 1, in which the communication bus is Controller Area Network (CAN).

5. The apparatus of claim 1, in which the communication bus is Local Interconnect Network (LIN).

6. The apparatus of claim 1, in which the number of satellite modules is six or more.

7. The apparatus of claim 1, in which the central module low side switch and first satellite low side switch are each n-channel metal oxide semiconductor field effect transistors (MOSFETs).

8. The apparatus of claim 1, additionally including a mechanism to detect a short circuit or open circuit fault in a faulty satellite module, determine the location of the faulty satellite module, and report the fault.

9. The apparatus of claim 1, in which:
    the first satellite module includes:
        a first voltage divider with a first resistor coupled on one side to the first current terminal of the central module low side switch and coupled on the other side to a first connecting terminal, a second resistor coupled on one side to the first connecting terminal and coupled on the other side to ground, and a third resistor coupled on one side to the first connecting terminal and coupled on the other side to the general purpose input of the first satellite MCU; and
    the second satellite module includes:
        a second voltage divider with a first resistor coupled on one side to the first current terminal of the first satellite module low side switch and coupled on the other side to a second connecting terminal, a second resistor coupled on one side to the second connecting terminal and coupled on the other side to ground, and a third resistor coupled on one side to the second connecting terminal and coupled on the other side to the general purpose input of the second satellite MCU.

10. The apparatus of claim 9, in which the resistances of the first resistor in the first voltage divider and the second voltage divider are greater than 1 Megohm.

11. The apparatus of claim 9, in which the voltage level applied to the general purpose input of the first satellite MCU is limited to no more than 4 V.

12. A process for auto addressing nodes on a communication bus comprising:

sending, using a dedicated single channel, a signal from a central module to a microcontroller on a first satellite module indicating that a first address is being transmitted on a communication bus, wherein the communication bus is separate from the dedicated single channel;

transmitting the first address on the communication bus;

assigning the first address to the first satellite module, then sending an acknowledgment signal on the communication bus from the first satellite module to the central module;

sending a signal from the first satellite module to a second satellite module on a dedicated single channel that is separate from the communication bus indicating that a second address is being transmitted on the communication bus;

transmitting the second address on the communication bus; and assigning the second address to the second satellite module, then sending an acknowledgment signal on the communication bus from the second satellite module to the central module.

13. The process of claim 12, in which the communication bus is CAN.

14. The process of claim 12, in which the communication bus is LIN.

15. The process of claim 12, in which the signals indicating that an address is being transmitted on the communication bus are sent using an n-channel MOSFET.

16. The process of claim 12, additionally including the central module reporting if a satellite module fails to send an acknowledgment signal on the communication bus.

17. The process of claim 16, in which the location of the satellite module failing to send an acknowledgment signal is reported to the central module.

18. An apparatus for a satellite module comprising:
a power converter having a power converter output;
an MCU having a general purpose input and output and a communication port;
a satellite low side switch having a control terminal coupled to the general purpose output of the MCU, a first current terminal coupled to ground and a second current terminal coupled to the power converter output and configured to be coupled to a general purpose input of a second satellite module;
a communication bus PHY having a first input/output port coupled to a communication bus and a second input/output port coupled to the communication port of the MCU;
and
a voltage divider with a first resistor configured to be coupled on one side to a current terminal of a master module low side switch and coupled on the other side to a connecting terminal, a second resistor coupled on one side to the connecting terminal and coupled on the other side to ground, and a third resistor coupled on one side to the connecting terminal and coupled on the other side to the general purpose input of the MCU.

19. The apparatus of claim 18, in which the voltage level applied to the general purpose input of the MCU is no greater than 4 V.

20. The method of claim 12, in which the signal indicating that a first address is being transmitted is a pulse-width-modulated signal.

* * * * *